US008389455B2

(12) United States Patent
Quillen et al.

(10) Patent No.: US 8,389,455 B2
(45) Date of Patent: *Mar. 5, 2013

(54) COMPOSITIONS AND METHODS FOR REMOVING ORGANIC SUBSTANCES

(75) Inventors: Michael Wayne Quillen, Kingsport, TN (US); Dale Edward O'Dell, Blountville, TN (US); Zachary Philip Lee, Conyers, GA (US); John Cleaon Moore, Camarillo, CA (US); Edward Enns McEntire, Kingsport, TN (US)

(73) Assignee: Eastman Chemical Company, Kingsport, TN (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/346,877

(22) Filed: Jan. 10, 2012

(65) Prior Publication Data
US 2012/0108486 A1 May 3, 2012

Related U.S. Application Data

(62) Division of application No. 12/413,085, filed on Mar. 27, 2009.

(51) Int. Cl.
C11D 3/37 (2006.01)
C11D 3/43 (2006.01)
C11D 7/34 (2006.01)

(52) U.S. Cl. ........ 510/175; 510/432; 510/475; 510/492; 510/505

(58) Field of Classification Search ............... 510/175, 510/432, 475, 492, 505
See application file for complete search history.

(56) References Cited

U.S. PATENT DOCUMENTS

| | | | |
|---|---|---|---|
| 3,582,401 A | 6/1971 | Berilla et al. |
| 3,734,874 A | 5/1973 | Kibler et al. |
| 3,779,993 A | 12/1973 | Kibler et al. |
| 3,828,010 A | 8/1974 | Davis et al. |
| 4,169,068 A | 9/1979 | Harita et al. |
| 4,233,196 A | 11/1980 | Sublett |
| 4,303,454 A | 12/1981 | Petterson et al. |
| 4,744,834 A | 5/1988 | Haq |
| 4,770,713 A | 9/1988 | Ward |
| 4,861,512 A | 8/1989 | Gosselink |
| 4,925,588 A | 5/1990 | Berrod et al. |
| 5,006,598 A | 4/1991 | Adams et al. |
| 5,091,103 A | 2/1992 | Dean et al. |
| 5,142,020 A | 8/1992 | Kud et al. |
| 5,182,043 A | 1/1993 | Morrall et al. |
| 5,218,042 A | 6/1993 | Kuo et al. |
| 5,290,631 A | 3/1994 | Fleury et al. |
| 5,415,807 A | 5/1995 | Gosselink et al. |
| 5,431,847 A | 7/1995 | Winston et al. |
| 5,436,312 A | 7/1995 | Exner et al. |
| 5,496,491 A | 3/1996 | Ward et al. |
| 5,502,118 A | 3/1996 | Macholdt et al. |
| 5,543,488 A | 8/1996 | Miller et al. |
| 5,547,612 A | 8/1996 | Austin et al. |
| 5,552,495 A | 9/1996 | Miller et al. |
| 5,552,511 A | 9/1996 | Miller et al. |
| 5,554,312 A | 9/1996 | Ward |
| 5,571,876 A | 11/1996 | Miller et al. |
| 5,602,089 A | 2/1997 | Pennaz |
| 5,605,764 A | 2/1997 | Miller et al. |
| 5,691,298 A | 11/1997 | Gosselink et al. |
| 5,698,512 A | 12/1997 | Austin et al. |
| 5,709,940 A | 1/1998 | George et al. |
| 5,710,119 A | 1/1998 | Busch et al. |
| 5,728,671 A | 3/1998 | Rohrbaugh et al. |
| 5,750,489 A | 5/1998 | Garcia et al. |
| 5,767,048 A | 6/1998 | Obuse |
| 5,786,318 A | 7/1998 | Blokzijl et al. |
| 5,834,412 A | 11/1998 | Rohrbaugh et al. |
| 5,843,878 A | 12/1998 | Gosselink et al. |
| 5,863,881 A | 1/1999 | Vlasblom |
| 5,911,835 A | 6/1999 | Lee et al. |
| 5,962,388 A | 10/1999 | Sherry et al. |
| 5,965,319 A | 10/1999 | Kobayashi |
| 5,985,816 A | 11/1999 | Vlasblom |
| 5,989,353 A | 11/1999 | Skee et al. |
| 6,007,749 A | 12/1999 | Wang et al. |
| 6,060,547 A | 5/2000 | Canter et al. |
| 6,071,868 A | 6/2000 | Kim et al. |
| 6,093,689 A | 7/2000 | Vlasblom |
| 6,127,097 A | 10/2000 | Bantu et al. |
| 6,146,815 A | 11/2000 | Komatsu et al. |

(Continued)

FOREIGN PATENT DOCUMENTS

| | | |
|---|---|---|
| DE | 19539394 A1 | 4/1996 |
| EP | 0 267 540 B1 | 5/1988 |
| EP | 0 388 592 A2 | 9/1990 |
| EP | 1 091 254 A2 | 4/2001 |
| EP | 1 860 508 A2 | 11/2007 |
| GB | 573145 A | 11/1945 |
| JP | 11-181494 | 7/1999 |
| WO | WO 90/00579 A1 | 1/1990 |
| WO | WO 03/012024 A1 | 2/2003 |
| WO | WO 2010/110847 A2 | 9/2010 |

OTHER PUBLICATIONS

Eastman Publication CB-41A, pp. 1-16, Dec. 2005.*
Fedynyshyn, T. et al; "Changes in Resist Glass Transition Temperatures Due to Exposure"; Advances in Resist Materials and Processing Technology XXIV; Proceedings of SPIE, vol. 6519; pp. 65197-1 through 651917-12 (2007).

(Continued)

Primary Examiner — Brian P Mruk
(74) Attorney, Agent, or Firm — Dennis V. Carmen

(57) ABSTRACT

Compositions and methods useful for the removal of organic substances from substrates, for example, electronic device substrates such as microelectronic wafers or flat panel displays, are provided. A method is presented which applies a minimum volume of the composition as a coating to the inorganic substrate whereby sufficient heat is added and immediately rinsed with water to achieve complete removal. These compositions and methods are particularly suitable for removing and completely dissolving photoresists of the positive and negative varieties as well as thermoset polymers from electronic devices.

5 Claims, No Drawings

U.S. PATENT DOCUMENTS

| | | | |
|---|---|---|---|
| 6,162,890 | A | 12/2000 | George et al. |
| 6,187,729 | B1 | 2/2001 | Hayes et al. |
| 6,211,127 | B1 | 4/2001 | Kim et al. |
| 6,239,094 | B1 | 5/2001 | Goderis et al. |
| 6,240,933 | B1 | 6/2001 | Bergman |
| 6,255,274 | B1 | 7/2001 | Becherer et al. |
| 6,310,263 | B1 | 10/2001 | Vlasblom |
| 6,319,884 | B2 | 11/2001 | Leduc et al. |
| 6,369,016 | B1 | 4/2002 | Vlasblom |
| 6,406,969 | B2 | 6/2002 | Kim et al. |
| 6,440,856 | B1 | 8/2002 | Bessho et al. |
| 6,455,479 | B1 | 9/2002 | Sahbari |
| 6,465,403 | B1 | 10/2002 | Skee |
| 6,514,656 | B1 | 2/2003 | Nakamura et al. |
| 6,551,973 | B1 | 4/2003 | Moore |
| 6,579,466 | B1 | 6/2003 | David et al. |
| 6,599,370 | B2 | 7/2003 | Skee |
| 6,600,142 | B2 | 7/2003 | Ryan et al. |
| 6,635,819 | B2 | 10/2003 | Awakura et al. |
| 6,670,107 | B2 | 12/2003 | Lachowski |
| 6,677,286 | B1 | 1/2004 | Rovito et al. |
| 6,815,151 | B2 | 11/2004 | Tanabe et al. |
| 6,821,352 | B2 | 11/2004 | Rovito et al. |
| 6,825,156 | B2 | 11/2004 | Lee et al. |
| 6,827,807 | B2 | 12/2004 | Westbrook et al. |
| 6,833,129 | B2 | 12/2004 | Löffler et al. |
| 6,837,943 | B2 | 1/2005 | Lee et al. |
| 6,851,873 | B2 | 2/2005 | Muraoka et al. |
| 6,884,571 | B2 | 4/2005 | Uenishi |
| 6,897,004 | B2 | 5/2005 | Uenishi et al. |
| 6,916,772 | B2 | 7/2005 | Zhou et al. |
| 6,943,142 | B2 | 9/2005 | Egbe et al. |
| 6,949,495 | B2 | 9/2005 | Suto et al. |
| 7,183,245 | B2 | 2/2007 | Moore |
| 7,198,681 | B2 | 4/2007 | Nguyen et al. |
| 7,247,208 | B2 | 7/2007 | Hsu |
| 7,256,165 | B2 | 8/2007 | Bertrem et al. |
| 7,385,751 | B2 | 6/2008 | Chen et al. |
| 7,402,341 | B2 | 7/2008 | Halahmi |
| 7,528,098 | B2 | 5/2009 | Lee et al. |
| 7,543,592 | B2 | 6/2009 | Lee |
| 7,687,447 | B2 | 3/2010 | Egbe et al. |
| 7,700,533 | B2 | 4/2010 | Egbe et al. |
| 2003/0130146 | A1 | 7/2003 | Egbe et al. |
| 2003/0138732 | A1 | 7/2003 | Nagase |
| 2003/0199406 | A1 | 10/2003 | Anzures et al. |
| 2003/0215754 | A1 | 11/2003 | Lundy et al. |
| 2004/0065540 | A1 | 4/2004 | Mayer et al. |
| 2004/0081922 | A1 | 4/2004 | Ikemoto et al. |
| 2004/0127374 | A1 | 7/2004 | Jo et al. |
| 2004/0137379 | A1 | 7/2004 | Ikemoto |
| 2004/0152608 | A1 | 8/2004 | Sherman |
| 2004/0159335 | A1 | 8/2004 | Montierth et al. |
| 2004/0159654 | A1 | 8/2004 | Ryan et al. |
| 2004/0220065 | A1 | 11/2004 | Hsu |
| 2005/0130862 | A1* | 6/2005 | Trouillet-Fonti et al. ..... 510/351 |
| 2005/0197265 | A1 | 9/2005 | Rath et al. |
| 2006/0014656 | A1 | 1/2006 | Egbe et al. |
| 2006/0099346 | A1 | 5/2006 | Martin et al. |
| 2006/0166847 | A1 | 7/2006 | Walker et al. |
| 2006/0293208 | A1 | 12/2006 | Egbe et al. |
| 2007/0027052 | A1 | 2/2007 | Yokoi et al. |
| 2007/0037719 | A1 | 2/2007 | Satoh |
| 2007/0078072 | A1 | 4/2007 | Yokoi et al. |
| 2007/0099120 | A1 | 5/2007 | Ohnishi |
| 2007/0111912 | A1 | 5/2007 | Phenis et al. |
| 2007/0144384 | A1 | 6/2007 | Inno et al. |
| 2007/0167343 | A1 | 7/2007 | Suzuki et al. |
| 2007/0224811 | A1 | 9/2007 | Wang et al. |
| 2007/0243773 | A1 | 10/2007 | Phenis et al. |
| 2008/0139436 | A1 | 6/2008 | Reid |
| 2008/0145797 | A1 | 6/2008 | Verbeke et al. |
| 2008/0163892 | A1 | 7/2008 | Huang et al. |
| 2008/0173328 | A1 | 7/2008 | Nishiwaki |
| 2008/0223414 | A1 | 9/2008 | Schuett |
| 2008/0230092 | A1 | 9/2008 | Ko et al. |
| 2008/0242102 | A1 | 10/2008 | Keating |
| 2008/0296767 | A1 | 12/2008 | Tamura et al. |
| 2009/0084406 | A1 | 4/2009 | Lee et al. |
| 2009/0120457 | A1 | 5/2009 | Naghshineh et al. |
| 2009/0156452 | A1 | 6/2009 | Mui et al. |
| 2009/0162537 | A1 | 6/2009 | Kolics et al. |
| 2009/0163402 | A1 | 6/2009 | George |
| 2009/0246700 | A1 | 10/2009 | Sonokawa |
| 2009/0247447 | A1 | 10/2009 | Tamura et al. |
| 2010/0016202 | A1 | 1/2010 | Mui et al. |
| 2010/0022426 | A1 | 1/2010 | Yokoi et al. |
| 2010/0055897 | A1 | 3/2010 | Chou et al. |
| 2010/0056409 | A1 | 3/2010 | Walker et al. |
| 2010/0070992 | A1 | 3/2010 | Morris et al. |
| 2010/0116290 | A1 | 5/2010 | Zhu et al. |
| 2010/0120647 | A1 | 5/2010 | Zhu et al. |
| 2010/0180917 | A1 | 7/2010 | Tanaka et al. |
| 2010/0242998 | A1 | 9/2010 | Quillen et al. |
| 2011/0229832 | A1 | 9/2011 | Kamimura et al. |

OTHER PUBLICATIONS

D'Amour, J. D. et al; "Modifications to Thermophysical Behavior in Ultrathin Polymer Films"; Advances in Resist Technology and Processing XX; Proceedings of SPIE, vol. 5039, pp. 996-1007 (2003).
Semi S3-91, Safety Guidelines for Heated Chemical Baths, http://www.etms2.com/safety/heatedchem.htm, Jan. 23, 2009.
Eastman Publication GN-389C, Sep. 1993.
Eastman Publication CB-41A Dec. 2005.
Morrison, Robert T. and Boyd, Robert N.; Organic Chemistry, 3d Ed.; Allyn & Bacon, Inc.; Boston, MA; Chapter 16, pp. 518-551 (Dec. 1973).
Co-pending U.S. Appl. No. 61/164,195, filed Mar. 27, 2009.
Co-pending U.S. Appl. No. 12/715,978, filed Mar. 2, 2010.
Co-pending U.S. Appl. No. 12/413,085, filed Mar. 27, 2009.
Co-pending U.S. Appl. No. 12/891,698, filed Sep. 27, 2010.
Co-pending U.S. Appl. No. 12/891,745, filed Sep. 27, 2010.
Notification of Transmittal of the International Search Report and the Written Opinion of the International Searching Authority, or the Declaration date of mailing Jun. 7, 2010 received in corresponding International Application No. PCT/US2010/000776.
Invitation to Pay Additional Fees and, Where Applicable, Protest Fee date of mailing Jun. 23, 2010 received in corresponding International Application No. PCT/US2010/000770.
Schumacher, Kevin et al.; "Benefits of Waterless Photo Resist Stripping"; Future Fab International; 1997; pp. 207-209; vol. 1, Issue 4.
Eastman Presentation "New Cleaning Technology for Microelectronic & Semiconductor Manufacturing" dated Feb. 2009.
Notification of Transmittal of the International Search Report and the Written Opinion of the International Searching Authority, or the Declaration date of mailing Nov. 11, 2010 received in corresponding International Application No. PCT/US2010/000770.
Office Action dated Jun. 17, 2011, for related U.S. Appl. No. 12/413,085, filed Mar. 27, 2009.
Notice of Allowance dated Oct. 5, 2011, for related U.S. Appl. No. 12/413,085, filed Mar. 27, 2009.
Notification of Transmittal of the International Search Report of the International Searching Authority, date of mailing Dec. 23, 2011, received in corresponding International Application No. PCT/US2011/051489.
Notification of Transmittal of the International Search Report of the International Searching Authority, date of mailing Jul. 26, 2012, received in corresponding International Application No. PCT/US2011/051148.
Notice of Allowance dated Jul. 24, 2012, for related U.S. Appl. No. 12/413,085, filed Mar. 27, 2009.
Office Action dated May 31, 2012, for related U.S. Appl. No. 12/891,698, filed Sep. 27, 2010.
Office Action dated Jun. 28, 2012, for related U.S. Appl. No. 12/891,745, filed Sep. 27, 2010.
Notice of Allowance for co-pending U.S. Appl. No. 12/715,978, filed Mar. 20, 2010.
Notice of Allowance for co-pending U.S. Appl. No. 12/715,978, filed Sep. 18, 2012.
Notice of Allowance for co-pending U.S. Appl. No. 12/413,085, filed Oct. 3, 2012.

* cited by examiner

COMPOSITIONS AND METHODS FOR REMOVING ORGANIC SUBSTANCES

CROSS REFERENCE TO RELATED APPLICATIONS

This application is a divisional of U.S. Application filed Mar. 27, 2009 having U.S. Ser. No. 12/413,085, now allowed.

FIELD OF THE INVENTION

The present invention relates generally to the removal of organic substances from a substrate. In particular, the present invention relates to a universal method with a range of compositions, which applies to the removal of both amorphous and thermoset polymers from electronic devices such as semiconductor wafers and flat panel displays (FPD), and other microelectronic substrates.

BACKGROUND

Various polymers are used in the manufacture of electronic devices, to include photoresists and organic-based dielectrics. Photoresists, for example, are used throughout semiconductor device fabrication in photolithographic operations. The resist is exposed to actinic radiation through a photomask. Where a positive-acting resist is used, exposure causes a chemical reaction within the material resulting in a solubility increase in aqueous alkali, allowing it to be dissolved and rinsed away with developer. In the case of a negative-acting material, crosslinking of the polymer occurs in the exposed regions while leaving unexposed regions unchanged. The unexposed regions are subject to dissolution and rinsing by a suitable developer chemistry. Following development, a resist mask is left behind. The design and geometry of the resist mask is dependent upon the positive or negative tone of the resist; positive tone resist will match the design of the photomask, while a negative tone resist will provide a pattern that is opposite the photomask design. The use of photoresists requires several cleaning steps with a final clean of the mask before the next circuit design process step is implemented.

Organic-based dielectrics represent engineering polymers used to offer insulative properties to the microelectronic circuit. Examples of these chemistries include polyimide (PI) and poly-(p-phenylene-2,6-benzobisoxazole) (PBO) as manufactured by Hitachi-DuPont Microsystems. Another popular organic insulator for electronic applications is bis-benzocyclobutene (BCB), manufactured by the USA-based, Dow Chemical Company. These polymers are applied to the substrate in a similar fashion as photoresists using conventional spin, spray, or they may be slit-coated as is common practice in manufacturing FPDs. For these application reasons, organic-based dielectrics may often be referred to as spin-on dielectrics. Once the polymer is applied, they may undergo a patterning process, but ultimately all of these systems lead to a final-stage cure, which permanently fixes the material in place by undergoing chemical and physical property changes. The final material exhibits both electrical and physical properties desirable for performance of the electric circuit. Once these organic-based dielectrics are fully cured, they are considered to be permanent, whereby, the need for rework would either require the use of aggressive materials such as strong acids or bases that likely would attack the substrate or adjacent metals or more practically, the rework condition would be considered as not commercially available.

Positive photoresists are commonly based upon resins of the novolac or polyhydroxystyrene (Phost) varieties chosen for high-resolution device processing in front-end semiconductor and flat panel display manufacturing. Positive-tone systems represent the largest volume portion of photoresists produced globally and there are many suppliers. Example suppliers of these systems for both semiconductor and FPD include the USA-based AZ Electronic Materials, the USA-based Rohm and Haas Corporation, and the Japanese company, Tokyo Ohka Kogyo Co Ltd. In positive photoresist applications, a substrate is etched by plasma processes, which use gases of inert and chemical varieties to produce both ionized and reactive species that travel through the mask and etch down into the substrate. During etching, ionized and reactive species combine with atoms of the substrate, form a by-product, and that by-product is vented away via the reduced pressure of the plasma system. These same gaseous species also impact the photoresist mask, baking it into place and also ejecting carbon-containing by-products into the plasma. Photoresist by-products mix with other species in the plasma and are continually directed down towards the substrate. These materials condense to form a residue along the sidewalls of the etched features, producing a desirable condition, otherwise referred to as anisotropic etching whereby species are highly controlled and directed into the substrate with little or no lateral loss. Upon completion, it is desired to remove this etch residue along with the resist mask, as they can have deleterious effects on subsequent processes and lead to reduced device performance or device failure. Such residues and their associated resist masks, however, can be difficult to remove, normally involving the use of formulated stripper chemistries.

Negative photoresists are commonly chosen for more rigorous process conditions whereby more aggressive chemical or thermal exposure processes may be used. These negative photoresists include isoprene (rubber), acrylic, and epoxy-based resins. Cyclized isoprene (rubber) photoresists are chosen for their high chemical resistance. Examples of these photoresists may be obtained from Fujifilm Electronic Materials, Ltd. under the trade name SC-Resist or HNR-Resist. Negative-tone isoprene resin resists are common in aluminum processing where a brief chemical etch is used to remove metal surrounding the masked feature. Negative-tone acrylic photoresists are commonly chosen for wafer-level-packaging bump formation. Suppliers include the USA-based Printed Circuits Division of E. I. duPont de Nemours and Company under the trade name Riston, and the Japan's JSR Corporation for dry-film and spin-on (wet) negative acrylics, respectively. Dry-film and spin-on acrylics offer an ability to deposit thick layers from 25 to 120 microns (um), used to pattern the corresponding solder bumps. Once the pattern is formed, metal deposition occurs by electroplating or screen-printing, a process that exposes the resist to heated acid or baking in excess of 250° C., respectively. Another popular negative resist, an epoxy system under the trade name of SU-8 ™, originally developed by International Business Machines (IBM) and now sold by the USA company, MicroChem Corporation, and Gersteltec Engineering Solutions, a Swiss-based company. The SU-8 ™ is commonly chosen for thick patterns that may exceed 300 microns (um), with a high-aspect ratio (i.e. height vs width), and with the pattern definition to exhibit extremely straight sidewalls. Because of the extremely unique characteristics of the SU-8 ™ epoxy resin, photoresists of this variety are chosen to manufacture large devices, and most commonly include microeletromechanical systems (MEMS). The varieties of negative-tone photoresists are significantly different from positive, their cleaning (removal) practice is even more rigorous. In fact, it is commonly understood that SU-8 ™ photoresist is considered to be a permanent system, removed only with more complex, time, and costly practices.

As with any process involving photolithography, it is desirable to completely remove the photoresist from the substrate in order to proceed successfully to the next process. Incomplete stripping of the photoresist can result in irregularities during the next etching or deposition step, which may cause quality and yield problems. For example, during solder bumping, resist contamination can prevent metal solder from wetting to a metal pad during the board assembly reflow processes, resulting in yield loss in a finished assembly. The same photoresist contamination is manifested as organic contamination in front end of line device patterning and results in the exact same non-wetting problems in an etch or deposition process. Such irregularities, no matter how small, continue to magnify the problem throughout manufacturing until during final device assembly and testing, the condition leads to poor mechanical and electrical contacts, which produce high resistance and heat, or worse, catastrophic electrical shorting.

Throughout each of these chemical processes, one can appreciate maximum selectivity in cleanliness and high throughput must be met without failure. Any problems associated with a lack of performance, presence of residue, or worse, a rise in process complexity, all will result in reduced yield and increased cost.

It is generally understood that the chemistry of positive tone resists are typically hydrophilic (polar) and amorphous (i.e. non thermoset and cross-linked), and it is for these reasons that these systems are believed to be easier to clean (remove) using conventional solvents and/or chemical strippers. The resins for positive-tone chemistries are based upon either novolac (cresol, phenol-formaldehyde) or polyhydroxystyrene (PHost), with occasional options of styrenated copolymer and/or acrylic/PMMA (polymethylmethacrylate). These chemistries offer good adhesion and fixing to a wide variety of surfaces while the hydroxyl groups present in the various forms of novolac (i.e. cresol, bis-phenol, etc.) provide intermolecular hydrogen bonding which aids in aqueous solubility. This condition combines during the photoconversion of the initiator diazonaphthoquinone (DNQ) in novolac systems, while in PHost systems, the acid catalyzed de-protection of the ester forms the more soluble alcohol. When used during normal operating conditions up to and including 100 degrees C., these systems remain soluble in polar solvents while their UV-exposure will produce counterparts that are soluble in aqueous-base.

As indicated here, the positive-tone resists are used as primary imaging masks for plasma-based etching. During this process, species in the plasma produce etch residue while exposing the mask to temperatures exceeding 150 degrees C. It is well known that etch residue (e.g. side wall polymer) is comprised of by-products of the plasma with organic constituents of photoresist. The chemistry of the residue may comprise constituents of the substrate, metal topography, and plasma gases, to include silicon, gallium, arsenic, boron, phosphate, titanium, tantalum, tungsten, copper, nickel, aluminum, chromium, fluorine, chlorine, as well as carbon containing compounds. In novolac systems which contain hydroxyl constituents, these elevated temperature exposure conditions will facilitate further reactions to form insoluble species. Such reactivity of hydroxyl groups with halides and active metals, especially in the heated and acidic conditions of a plasma, to produce alkyl halides, esters, and, in some cases, high molecular weight polymers is known (Morrison, R. T. and Boyd, R. N., *Organic Chemistry*, 3rd Ed., Allyn & Bacon, Inc., Boston Mass., Ch. 16 (1973)). Conventional cleaning of etch residue and overexposed photoresist masks resulting from the effects of hot plasma etching require the use of chemical strippers processed at elevated temperatures for extended periods of time dependent upon the process and tool.

Typical measurement used to predict stripping challenges of bulk resins includes thermal analysis determination of glass transition (Tg). Relatively unchanged Tg values are observed in positive-tone photoresists and similar amorphous systems (Fedynyshyn, T. et al., *Proc. SPIE* 6519, 65197-1 (2007)). Detectable increases of Tg in photoresists have been observed to be a function of the evaporative loss in solvent, which in turn, will depend upon the thickness of the photoresist coating. Most notable are observed increases in Tg with radiation and thermal exposure with polymer crosslinking (J. D. D'Amour et al., *Proc. SPIE* 5039, 966 (2003)). Such crosslinking of high temperature exposed novolac resins and negative-tone systems is consistent with the presence of higher molecular weight species as detectable by increased values of Tg.

Cleaning (removal) of photoresist etch residue and the mask use complex chemical strippers composed of organic solvents, amines, water, reducing agents, chelating agents, corrosion inhibitors, and surfactants. The reducing agent, hydroxylamine, has been cited extensively in the literature as a basic material which facilitates dissolution of photoresist and its residue while offering protection of underlying aluminum metal features. Common practice in using stripper chemistries involves delivery of large volumes of stripper to the substrate to be cleaned at a specific temperature for a given period of time.

As the industry continues to replace aluminum with copper to capture improved performance in their devices, the stripper chemistries must also be adjusted. Hydroxylamine may be acceptable for cleaning of aluminum devices; however, it is too aggressive for copper. Device architecture using copper and low-K (dielectric constant, K), e.g. Cu/Low-K, require fluorinated-based chemistries to remove silicon-laden etch residue. Amines and ammonia compounds are known to be complexing agents for Cu and are observed to etch (attack) copper metal. Additionally, fluorinated and glycol-based stripper chemistries are considered toxic and exhibit elevated viscosities.

Negative photoresists used in forming wafer bumping metallization masks generally include acrylic, styrenic, maleic anhydride or related monomers and copolymers. Such materials are used to produce photosensitive thick films. These photoresists are commonly referred to as "acrylic" polymer systems due to the pendant groups on the main polymer chains, which include vinyl groups common to acrylics. In general, the dry-film form of acrylic photoresists is chosen where exposure to rigorous process conditions is required. As a result of this exposure, the cleaning of dry-film masks and residues presents a stripper challenge. When a dry-film system is removed, the material is typically not dissolved. Rather, many chemical strippers interact with the material to cause lifting or peeling from the substrate, resulting in the generation of suspended insoluble flakes and particles. Such insoluble materials can lead to filter fouling and performance degradation in the processing tool. This can create a significant loss in productivity as a result of process tool downtime for maintenance. In addition, the failure to filter off or rinse away particles may result in the formation of residue on the final product and contribute to yield loss.

Resist stripping compositions that include aromatic quaternary ammonium hydroxide such as benzyltrimethylammonium hydroxide (BTMAH), a solvent such as an alkylsulfoxide, a glycol and a corrosion inhibitor and non-ionic surfactant do not completely remove many dry-film resists from a wafer surface. Similarly, compositions which use pyrrolidone-based solvents such as N-methylpyrrolidone (NMP) exhibit the same drawback in that they cannot achieve complete removal of many dry-film resists. In general, compositions which include a quaternary ammonium hydroxide as tetramethylammonium hydroxide (TMAH) in NMP do not completely dissolve many dry-film resist. As discussed above, incomplete dissolution produces particles that can become a source of contamination resulting in yield loss.

Similar experience is noted for negative-tone photoresist of the rubber-based resin variety. Stripper chemistries used to clean residue and masks resulting from rubber photoresists include a hydrocarbon solvent and an acid, commonly a sulfonic acid. High acidity is required for performance and emulsification of hydrolyzed rubber components. Representative inhibitors include mercaptobenzotriazole (MBT) and related triazoles to prohibit attack upon adjacent metallic features. A common inhibitor for these chemistries includes catachol, a toxic and carcinogenic material. Further, rinse steps for hydrocarbon strippers of this variety must use isopropanol (IPA) or related neutral and compatible solvents. This rinse practice, albeit a cost increase, will reduce the effects of metal attack to adjacent metals due to a pH-drop during water mixing with constituents of the stripper. Due to compatibility issues, wastes from the use of hydrocarbon-based strippers must be segregated from normal organic streams in a microelectronic fab.

While it is important to give attention to the challenges of polymer and residue removal from the standpoint of the stripper chemistry, equal diligence is necessary towards the design of the process and proper performance of the tool. It is generally understood that the primary purpose of the cleaning tool is to provide control in the process. Variability between part batches is reduced by the operation of the tool. Barring any mixing or chemical adjustments made by the unit, the variables available to the tool for control include temperature, agitation, and time. With an ever-present intensive pressure to increase throughput in a manufacturing line, a constant emphasis is to decrease the process time. Again, without a change in chemistry, this leaves as the only option to increase temperature and agitation, with the expectation that polymer dissolution rates will increase resulting in shorter process time. However, other reactions which are contradictory to the objectives of the process, such as corrosion rate, will also increase with increase in temperature and agitation. Additionally, and most important, there is continued loading of the stripper chemistry with the organic substance, causing a reduction in bath life and accelerates the observation of residue or other phenomena that indicate a drop in performance.

On the temperature continuum, bath life may be facilitated by increasing temperature or agitation. Where agitation must be controlled to protect substrate features, bath life conditions may be increased through increased polymer dissolution with increasing temperature. There is a fundamental safety limit as communicated by industry guidelines (SEMI S3-91, *Safety Guidelines for Heated Chemical Baths*). In accordance with SEMI, liquid over temperature shall be controlled at not more than 10 degrees C. above the normal operating temperature of the liquid, where the typical operating temperature does not exceed the flashpoint of the liquid. Many companies will set policy which is more restrictive such as operating at 10 degrees C. below the flashpoint and setting the over temperature to be the flashpoint. These criteria and others may best be observed in the processing of flat panel displays (FPDs).

Resist stripping at a FPD manufacturing plant occurs on large substrates traveling on a conveyor from one chamber to another. The resist is stripped from the panel by a stripper delivered by a sprayer that floods the entire glass surface, traveling to a rinse stage where distilled, deionized, or demineralized water or an alternative solvent is sprayed onto the surface, and the process is completed with a drying step that includes a hot air knife. Stripping is supported by at least two product tanks which are separate and distinct and arranged in-line with the flow direction of the parts. Substrates entering the tool will be first "washed" by the chemistry in the first tank. The stripper is sprayed onto the substrate surface, and upon reacting with the resist and flowing off of the substrate, it is collected and returned to the tank where it is subsequently heated and filtered such that any suspended and undissolved materials are removed from the bulk chemistry. The filtered and heated stripper is then cycled back to the spray chamber where it is delivered to the substrate in a continuous manner that optimizes the resist stripping process.

As the part travels on the conveyor from the first chamber supported by tank #1 to the next chamber supported by tank #2, there is a fundamental purity change in the stripper. Although the conditions of operation for tank #2 may be the same as that for tank #1, the amount of resist present is lower than that for tank #1. Typical processing times are defined for chamber #1 to offer a dwell time of the chemistry in contact with the resist which optimizes resist stripping and maximum removal. Over time, tank #1 will reach a maximum loading capacity for dissolved resist and a decision to replace the contents will be necessary. When this occurs, the contents of tank #1 will be sent to waste and replaced by the contents of tank #2. The contents of tank #2 will be replaced with fresh stripper (i.e. pure stripper). In this manner, the system is said to operate in a counter-current fashion. Namely, the process flow of parts is "counter" or opposite to the flow direction of the chemistry. By using this practice, tanks #1 & #2 become the dirty and clean tanks, respectively. In other words, the unwanted resist is concentrated in the front of the line while the cleanest chemistries remain near the end whereby after this point, the product substrate is rinsed and dried.

The configuration given here for the FPD example is consistent with most, if not all, in-line bench style tools and with many batch style-processing tools. In a bench tool, parts move from one station to another while the tanks are at fixed locations. In a batch style tool, the parts may rotate but remain at a fixed location, while the chemistry is being delivered by spraying. There will be two tanks, the tool will pump from one or the other and carry-out counter-current cleaning designs by the use of "dirty" and "clean" tanks.

There is an equal, yet unsatisfied, need to achieve selectivity during processing with these formulated strippers. Namely, as the use of more aggressive chemistries is put into practice to achieve a desired cleaning performance in ever reducing time, this practice must be met without damage to sensitive metals and the underlying substrate. This is especially challenging as many of the acids or alkalis of choice will rapidly "spike" the pH of the system, once they are mixed with water during the rinse step, causing galvanic corrosion to substrate metals. During the rinse stage on a FPD line, water is sprayed on the heated glass surface that contains residual stripper. No surfactants are used in a FPD line, in fear that a foam condition will occur and ultimately cause catastrophic failing of filters, pumping of dry air bubbles, and worse, contaminating the fab by overflowing stripper which may trigger electrical shorting and lead to a fire. Since no surfactants are used, there is irregular diffusion due to rising surface tension from the organic stripper to the aqueous condition. Irregular mixing and spreading cause momentary dead spots on the panel, which contribute to accelerated corrosion. The corrosive byproduct and foaming condition may be avoided through rinsing with neutral solvents such as isopropanol (IPA). Although this practice is accepted by several FPD manufacturers, it is both expensive and a flammability hazard.

There is a need, accordingly, for improved stripping compositions which will remove the processed resist in a rapid manner while maintaining safety towards the underlying metallurgy during rinsing with distilled, deionized, or demineralized water, and preventing corroding, gouging, dissolving, dulling, or otherwise marring the surfaces throughout the entire process. Further, growing initiatives exist within the industry to move towards being "green." A green process and the associated chemistries are those which will reduce or eliminate the use and generation of hazardous substances. According to the American Chemical Society's Green Chemistry Institute, there are twelve (12) principles which help to define a green chemistry.

This review of polymeric substances in microelectronic fabrication presents serious and compelling challenges in the industry. Where organic dielectrics are used, there is a continuing need for processes and compositions which may be used to effectively re-work a cured polymer by dissolving and cleaning the unwanted material from the underlying substrate. In cases of positive photoresists, there is a similar and continuing need for processes and compositions to effectively remove polymer from a substrate without deleterious effects to adjacent metal features. Finally, in the case of negative-tone photoresists, the same need exists for processes and compositions to effectively remove polymer from a substrate without deleterious effects to adjacent metal features. Although all of these materials are organic in origin, their chemistry is different and presents unique challenges that must be overcome in order to effect the desired cleaning result.

While there is a desire to address the removal needs of organic substances with unique compositions, there also, is a challenge to design a process that is supported by a tool which will enable rapid processing of parts, rinsing with water, without deleterious effects to the substrate. There is a continuing emphasis for the microelectronics industry to be green through improving the safety of operations, reducing the use of chemistry, and reducing the generation of hazardous waste. Taking these challenges together, there is a pressing need to provide a consistent and universal process, which uses compositions of matter that vary depending upon the performance needs of the unique polymer or residue to be removed, which provides high performance, high throughput, a green process, all at a reduced cost of ownership.

SUMMARY OF THE INVENTION

A first embodiment of the present invention concerns a composition for cleaning organic resin from inorganic substrates consisting of a solvent or mixture of solvents; and at least one sulfonated polyester at a weight % of greater than 10%, wherein the solvent is selected from the group consisting of diethylene glycol, diethylene glycol monoethyl ether, diethylene glycol monomethyl ether, diethylene glycol monobutyl ether, diethylene glycol monopropyl ether and mixtures thereof.

Another embodiment concerns a composition for removing organic resin from inorganic substrates comprising, an organic solvent or mixture of solvents at a weight % of from about 0.5% to about 99.0%, and at least one water soluble, water dispersible or water dissipatable polyester at weight % of from about 0.5% to about 99.0% Component B, and at least one additive which enhances cleaning performance at a weight % of from about 0.01% to about 99.0%.

Still another embodiment concerns a method for removing organic resin from inorganic substrates comprising, (a) coating said organic resin with a composition comprising: i) an organic solvent or mixture of solvents at a weight % of from about 0.5% to about 99.0%, and ii) at least one water soluble, water dispersible or water dissipatable polymer at weight % of from about 0.5% to about 99.0% Component B, (b) heating the substrate to a temperature and for a time sufficient to achieve dissolution of the organic resin, and (c) rinsing the substrate with a volume of a rinsing agent sufficient to remove the composition and the organic resin

DETAILED DESCRIPTION OF THE INVENTION

The present invention provides stripping compositions and methods, which quickly and effectively remove polymeric organic substances from inorganic substrates, from metallic, non-metallic and metallized non-metallic substrates. The stripping composition comprises an organic solvent, a water-soluble polymer and optionally various additives, which effectively removes organic substances and their residues of thermoplastic or thermoset nature that comprise the basis for fabricating microcircuits in electronic manufacturing. The additive(s) enhance or improve the cleaning performance of the stripping composition. The method defines a practice of coating the composition onto the substrate, heating the substrate to a specific temperature for a given time sufficient to achieve dissolution of the organic substance, and finishing with removal of the by-product by rinsing. The composition and method work together to provide performance and other desired goals in manufacturing not normally seen in conventional stripper processes. Although the organic substances to be removed may be cured to a hard and chemically resistant framework when exposed to the customer's process, the invention is found to maintain acceptable performance.

Whenever the term "water-dissipatable" or "water-dispersible" is used in this description, it will be understood to refer to the activity of a water or aqueous solution on the monomer (Component B). The term is specifically intended to cover those situations wherein a water or aqueous solution dissolves and/or disperses the monomer material therein and/or therethrough.

The terms "stripping", "removing", and "cleaning" are used interchangeably throughout this specification. Likewise, the terms "stripper", "remover", and "cleaning composition" are used interchangeably. The term "coating" is defined as a method for applying a film to a substrate such as spray coating, puddle coating, slit coating or immersing. The terms "film" or "coating" are used interchangeably. The indefinite articles "a" and "an" are intended to include both the singular and the plural. All ranges are inclusive and combinable in any order except where it is clear that such numerical ranges are constrained to add up to 100%. The term "wt %" means weight percent based on the total weight of the components of the stripping composition, unless otherwise indicated.

A process according to the present invention can involve submerging the inorganic substrate in a bath of the composition according to the present invention or preferably by applying the composition as a coating to the inorganic substrate. Once the substrate is submerged in the composition or the composition is applied and covers, or coats, the entire area, heating of the substrate begins. A rapid rate of heating occurs until the desired temperature is reached and is held for a desired period of time. Alternatively, the bath into which the substrate is submerged could be maintained at the desired temperature. Rinsing with a rinsing agent occurs and is followed by a drying step. The total method of practice involves three (3) distinct steps, namely, the coating, heating, and rinsing. As used herein, the term "rinsing agent" includes any solvent which removes the composition and material to be stripped. Examples of stripping agents include water, acetone, isopropyl alcohol and mixtures thereof.

An embodiment of the invention concerns a method whereby a composition of the present invention is applied as a liquid coating in direct contact with the substance to be removed. The method includes heating anywhere from approximately 25° C. to about 400° C. or from about 100° C. to about 250° C. Variability in temperature will depend upon the nature and thickness of the organic substance. The heating step process time can be from about 5 seconds to about 10 minutes, from about 10 seconds to about 8 minutes, or even from about 30 seconds to about 4 minutes. Moreover, the entire process time can vary anywhere from <15 seconds to 180 seconds, in some cases, to 5 minutes to 10 minutes. The variability in time is dependent upon the material to be removed, its thickness, and exposure condition. For example, for a PHost or Novolac resin, the heating step could be from about 15 seconds to about 1 minute. However, for other, more highly cured resins, the heating step can last from about 2 to 4 minutes or even longer. Once the diffusion of the organic substance is complete, rinsing with a rinsing agent such as distilled, deionized, or demineralized water may be performed.

Rinsing is facilitated by the presence of the water-soluble polymer in the composition. This polymer performs as a carrier system for the organic substance to be removed from the inorganic substrate. The rinsing agent used for rinsing can be at a temperature of about 5° C. to about 100° C. However, rinsing can also occur at room temperature and performs two objectives, to remove the dissolved organic substance, and to reduce the temperature of the substrate such that next stage normal tool handling may proceed.

Compositions of matter used in this invention include a major component to be a solvent system of the varieties which include one or more esters selected from the group consisting of structures (I) R—$CO_2R_1$, glycol ether esters of structures (II) $R_2$—$CO_2C_2H_4(OC_2H_4)_n$—$OR_3$, (III) $R_4$—$CO2C3H_6$ $(OC_3H_6)_n$—$OR_5$ and (IV) $R_6OCO_2R_7$, alcohols selected from structures (V) $R_8OH$, (VI) $R_9OC_2H_4(OC_2H_4)_nOH$, (VII) $R_{10}OC_3H_6(OC_3H_6)_nOH$, (VIII) $R_{11}(OC_2H_4)_nOH$, and (IX) $R_{12}(OC_3H_6)_nOH$, ketones selected from structures (X) $R_{13}COR_{14}$, sulfoxides selected from structure (XI) $R_{15}SOR_{16}$, and amides such as N,N-dimethyl formamide, N,N-dimethyl acetamide, and N-methyl pyrolidone, wherein R, $R_1$, $R_2$, $R_3$, $R_4$, $R_5$, $R_6$, $R_7$, $R_8$, $R_9$, $R_{10}$, $R_{11}$, $R_{12}$, $R_{13}$, $R_{14}$, $R_{15}$, and $R_{16}$ are independently selected from hydrogen or $C_1$-$C_{14}$-alkyl groups and n represents a repeating unit ranging from 1 to 10. Further, suitable solvents include, but are not limited to ketones such as cyclohexanone, 2-heptanone, methyl prowl ketone, and methyl amyl ketone, esters such as isopropyl acetate, ethyl acetate, butyl acetate, ethyl propionate, methyl propionate, gamma-butyrolactone (BLO), ethyl 2-hydroxypropionate (ethyl lactate (EL)), ethyl 2-hydroxy-2-methyl propionate, ethyl hydroxyacetate, ethyl 2-hydroxy-3-methyl butanoate, methyl 3-methoxypropionate, ethyl 3-methoxy propionate, ethyl 3-ethoxypropionate, methyl 3-ethoxy propionate, methyl pyruvate, and ethyl pyruvate, ethers and glycol ethers such as diisopropyl ether, ethyleneglycol monomethyl ether, ethyleneglycol monoethyl ether, and propylene glycol monomethyl ether (PGME), glycol ether esters such as ethyleneglycol monoethyl ether acetate, propyleneglycol methyl ether acetate (PGMEA), and propyleneglycol propyl ether acetate, aromatic solvents such as methylbenzene, dimethylbenzene, anisole, and nitrobenzene, amide solvents such as N,N-dimethylacetamide (DMAC), N,N-dimethylformamide, and N-methylformanilide, and pyrrolidones such as N-methylpyrrolidone (NMP), N-ethylpyrrolidone (NEP), dimethylpiperidone, 2-pyrrole, N-hydroxyethyl-2-pyrrolidone (HEP), N-cyclohexyl-2-pyrrolidone (CHP), and sulfur containing solvents such as dimethyl sulfoxide, dimethyl sulfone and tetramethylene sulfone. Although these organic solvents may be used either individually or in combination (i.e., as mixtures with others), the preferred solvent system should contain diethylene glycol (DEG, Eastman Chemical Company), diethylene glycol monoethyl ether (DE Solvent, Eastman Chemical Company), and diethylene glycol monopropyl ether (DP Solvent, Eastman Chemical Company).

An embodiment of the composition includes of one or more of these said solvents at about 0.5 weight percent to about 99.5 weight percent. In one embodiment, the solvent is present in the solvent composition at a weight % of from about 40% to about 97% or at a weight % of from about 60% to about 90%.

The composition also contains a polymer, which exhibits the property of water solubility, water dispersibility, or water dissipatability present at about 0.5 to about 99.5 weight percent and derived from, but not limited to, alcohol ethoxylates, bisphenol ethoxylates and propoxylates, alkylbenzene salts, cellulose acetate phthalate, cellulosic derivatives of alkoxyethyl and hydroxypropyl, copolymers of ethylene and propylene oxide, dendritic polyesters, ethoxylated amines, ethoxylated alcohol salts, ethylene acrylic acid, hydroxymethacrylates, phosphate esters, polyethylene glycols, polyethylene imine, polyethylene oxides, polyvinyl alcohol, polyvinyl pyrollidinone, starch, styrene maleic anhydride, sulfonated acrylics, sulfonated polystyrenes, sulfopolyester of the linear or branched formula, or rosin acids. The composition includes one or more of these polymers at about 10.0 weight percent to about 99.5 weight percent. In one embodiment, the polymer is present in the solvent composition at a weight % of from about 12.0 to about 60.0 or at a weight % of from about 15.0 to about 30.0.

In an embodiment, the water soluble polymer includes one or more sulfonated polyesters (sulfopolyesters) of the linear or branched varieties respectively, or mixtures thereof. The sulfopolyester is comprised of (i) monomer residues of at least one dicarboxylic acid; and (ii) about 4 to 25 mole percent, based on the total of all acid and hydroxyl equivalents, of monomer residues of at least one difunctional sulfomonomer containing at least one metal sulfonate group bonded to an aromatic ring, wherein the functional groups are hydroxy or carboxyl or amino and the metal of the sulfonate group is Na, Li, K, Mg, Ca, Cu, Ni, Fe and mixtures thereof; and optionally (iii) monomer residues of at least one poly(alkyene glycol) having the formula —$(OCH_2CH_2)n$— wherein n is 2 to about 500, provided that the mole percent of such residues in inversely proportional to the value of n; and (iv) up to about 75 mole percent of monomer residues of at least one diol, wherein said diol is other than a poly(alkylene glycol).

Suitable sulfopolyester polymers for use in this invention are those known as Eastman AQ® polymers and Eastman AQ Copolyesters. In general, suitable polymers are such polymers prepared from dimethyl-5-sodiosulfoisophthalate and its parent acid and salts, which may be derived from such co-monomers as isophthalic acid, terephthalic acid, and their esters. Diols commonly used with such acid co-monomers are diethylene glycol, ethylene glycol, triethylene glycol, polyethylene glycol, propylene glycol, 2-methyl propane diol, neopentyl glycol, 1,6-hexanediol, and the like.

The polymer can be selected from water soluble, water dispersible or water-dissipating sulfopolyesters or polyesteramides (herein after referred to collectively as sulfopolyesters) containing ether groups and sulfonate groups having a glycol residue and a dicarboxylic acid residue and at least one difunctional comonomer containing a sulfonate group attached to an aromatic nucleus and in the form of a metallic salt. Such polymers are well known to those skilled in the art and are available from Eastman Chemical Company under the tradename of Eastman AQ polymers. In particular, such sulfopolyesters can be dissolved, dispersed or otherwise dissipated in aqueous dispersions, preferably at temperatures of less than about 80° C. Such polyesters are described in greater detail in U.S. Pat. No. 3,734,874 the disclosure of which is incorporated herein by reference. One skilled in the art will understand that the term "residue" or "component" as used in the specification and concluding claims, refers to the moiety that is the resulting product of the chemical species in a particular reaction scheme or subsequent formulation or chemical product, regardless of whether the moiety is actually obtained from the chemical species. Thus, for example, an ethylene glycol residue in a polyester refers to one or more —OCH2CH2O— repeat units in the polyester, regardless of whether ethylene glycol is used to prepare the polyester.

The aforedescribed polyester material is prepared according to the polyester preparation technology described in U.S. Pat. Nos. 3,734,874; 3,779,993; 3,828,010, 4,233,196, 5,006, 598, 5,543,488, 5,552,511, 5,552,495, 5,571,876, 5,605,764, 5,709,940, 6,007,749 and U.S. Pat. No. 6,162,890 the disclosures of which are incorporated herein by reference, and the use of the term "acid" in the above description and in the appended claims includes the various ester forming or condensable derivatives of the acid reactants such as the dimethyl esters thereof as employed in the preparations set out in these patents. Examples of sulfo-monomers are those wherein the sulfonate group is attached to an aromatic nucleus such as benzene, naphthalene, biphenyl, or the like, or wherein the nucleus is cycloaliphatic such as in 1,4-cyclohexanedicarboxylic acid.

Additives to the composition may comprise about 100 parts-per-million (ppm) to about 99 weight percent of an alkali or acid of organic or inorganic origin to include ammonium hydroxide, quaternary hydroxides such as tetramethyl ammonium hydroxide (TMAH), tetraethyl ammonium hydroxide (TEAH), and benzyltrimethyl ammonium hydroxide (BTMAH), amines such as triethylene tetramine, alkanolamines which include monoethanolamine, monoisopropanolamine, diglycolamine, elemental hydroxides, or alkoxides such as potassium tertiary butyl hydroxide (KTB), alkyl-sulfonic acids such as methanesulfonic (MSA), Toluenesulfonic (TSA), and dodecylbenzene sulfonic acid (DDBSA), formic acid, fatty acids, sulfuric acid, nitric acid, or phosphoric acids. The additive can be present in an amount of from about 0.1 weight percent to about 60 weight percent, about 1.0 weight percent to about 50 weight percent, or about 5 weight percent to about 40 percent.

In an embodiment, the cleaning composition includes an organic solvent or mixture of solvents at a weight % of from about 0.5% to about 99.0%, at least one sulfonated polyester at weight % of from about 0.5% to about 99.0%, and at least one additive which enhances cleaning performance at a weight % of from about 0.01% to about 99.0%. Moreover, the solvent is selected from the group consisting of ethylene glycol, diethylene glycol, propylene glycol, diethylene glycol ethyl ether, diethylene glycol methyl ether, diethylene glycol butyl ether, diethylene glycol propyl ether, ethylene glycol propyl ether, ethylene glycol butyl ether and mixtures thereof.

In another embodiment, the cleaning composition includes the solvent at a weight % of from about 30% to about 95%, the polymer at a weight % of from about 3% to about 60%, and the additive at a weight % of from about 2% to about 60%.

The composition may also include an inhibitor which acts as a protecting agent for substrate composition. The inhibitors include chelating, complexing, or reducing agents, comprising one or more of the known varieties, including benzylic hydroxides such as catechol, triazoles, imidazoles, borates, phosphates, and alkyl or elemental silicates, ethylenediaminetetraacetic acid, diethylenetriaminepentaacetic acid, nitrilotriacetic acid, and 2,4-pentanedione, reducing sugars, hydroquinones, glyoxal, salicylaldehyde, fatty acids such as citric and ascorbic acid, hydroxylamines, or vanillin.

The compositions according to the present invention may also include a surfactant including one or more of the known varieties, including nonionic nonyl-phenols and nonylethoxylates, anionic forms that include alkyl-sulfonates, phosphate esters, and succinates, and fluorinated systems.

Contact is made to the substrate by the composition via bath submersion or using a coating practice. In microelectronic manufacturing, spin coating is the method of choice used to apply coatings to a substrate. However, other methods exist to include spray-spin coating and slit coating for large substrates as in FPD manufacturing. In all cases, the objective is to apply the composition in a manner to achieve complete coverage. Normally, most coating applications are concerned with a high degree of uniformity. In this invention method, a minimum thickness shall be established, typically on the order of a minimum value of 1000 microns (1 um=$1\times10^{-6}$ m), but some cases where the organic substance is very thin, the composition thickness may be smaller. In one embodiment of the present invention, the coating can be up to about 800 microns thick, between about 200 to about 600 microns thick, or from about 300 to about 400 microns thick.

Common practice for spin-coating the composition for this invention method is to dispense the material at the center of a substrate, and operate the equipment at a low rate of circular motion speed (i.e. <100 revolutions per min, rpm). Liquid delivery may be done by a static method, whereby the fluid will "puddle" onto the surface. A dynamic method may also be used where the material is dispensed when the substrate is already in motion. During the early stages for a new process set-up, the exact conditions of rpm and time may need to be established in such a manner to ensure complete coverage of the substrate with minimal or no waste. There is no need to be concerned with edge bead formation as this condition will be irrelevant to the process objective.

The manipulation of spin-speed is a common focus of many apparatus used in the microelectronics industry. Substrate rotation will have a direct affect on these properties and produce different coating results. At low spin-speeds, fluid mobility will be low with minor material loss, however, irregularities in substrate coverage may also occur. Alternatively, high spin-speeds will result in high mobility and high material loss. Although spin-coating is a standard practice in the industry, experience shows that thick coatings of acceptable thickness uniformity may be achieved with a spray-coating practice. Once the coating is completed, heat activation of the process may immediately proceed.

Heat application may be conducted through several paths. For manual operations, a simple hot-plate may be used. This requires the substrate to be moved from one location to another. In situations where automation is of interest, the wafer may remain stationary while heat is applied using a base-chuck or an overhead IR convection source. Exact ergonomics and logistic concerns with respect to controls and throughput can be readily determined by those skilled in the art of tool design. Once the proper heating regime is followed, the composition and organic resin may be removed by rinsing with a rinsing agent either in an agitated batch or by direct spray contact.

The stripping compositions of the invention function by maintaining a solvency environment when used on amorphous organic substances such as positive-tone photoresists of the PHost or novolac varieties. In such cases and when exposure conditions include moderate temperatures up to 150 degrees C., a composition which contains the minimum constituents, including the solvent system and water soluble polymer, is coated and processed at the conditions of the invention method. When heated to a sufficient temperature, rapid dissolution occurs and diffusion of the photoresist into the composition proceeds rapidly to completion. Additives such as an alkali agent, inhibitor, and surfactant may be used to facilitate good results with highly baked (i.e. >150 degrees C.) photoresists. Advantages in using additives contained within the stripping composition may include improved dissolution rates due to saponifying cross linked photoresist while the inhibitors protect exposed metal during the stripping and rinsing steps.

Organic alkanolamine compounds are preferred for alkaline saponifying and emulsification of the positive-tone photoresists, to include one or more low molecular weight candidates, for example, monoethanolamine (MEA), monoisopropanolamine (MIPA), or diglycolamine (DGA), and combinations thereof. In cases where a negative-tone acrylic photoresist or a cured thermoset polyimide are the candidates to be removed, the composition will require a strong alkali, namely, a quaternary hydroxide, metal hydroxide, or alkoxide.

Similar to the review given here for removing coatings and residues from positive and negative acrylic, as well as polyimide, compositions also apply for removal of negative isoprene (rubber) resist and negative-epoxy (SU-8™) photoresist. As we have determined for the positive photoresist and negative acrylic and polyimide, the choice in composition is dependent upon the material to remove. For negative-isoprene, the chemistry is hydrophobic (non-polar) and the cross linked rubber system does not respond to alkalis, only acids. Rubber photoresists require aromatic solvents and hydrophobic acids, such as dodecylbenzene sulfonic acid. For negative epoxy photorest, the chemistry is hydrophilic (polar) and like the rubber photoresists, these systems also do not respond to alkalis. The preferred system is one which incorporates hydrophilic acids such as methanesulfonic acid (MSA) or sulfuric acid. These systems all contain the water soluble polymer, to facilitate proper rinsing following dissolution of the photoresist.

EXAMPLES

The following examples further illustrate the present invention. All percentages given are by weight unless otherwise specified.

The invention is further illustrated, without limitation, by the following examples. In the first three examples, the measurement of performance and selectivity of the invention is conducted using practices readily accepted by the industry. In such cases, measurement is made by optical microscope and where necessary, the use of etch rate determinations by high sensitivity gravimetric reviews on metallic substrates, and where necessary, more detailed studies were conducted using scanning electron microscopy (SEM). In the following examples, silicon wafers were used as the inorganic substrate upon which the organic substance is applied and cured. The following items in Table 1 represent the organic substances to be removed, their preparation methods, and the sources from which they were procured.

TABLE 1

List of Organic Resins Used to Demonstrate the Invention.

| Example # | Material | Form | Type | Description/ Manufacturer |
|---|---|---|---|---|
| 1 | PHost | Solid resin worked up as liquid | Amorphous, positive | Equal quantities as 1:1 w/wwt % PB5 and PB5W resin (Hydrite Chemical Co., Brookfield WI), dissolved in PGMEA* as 20 wt % solids |
| 2 | Novolac | Solid resin worked up as liquid | Amorphous, positive | Equal quantities as 1:1 w/wwt % Rezicure 5200 and 3100 (SI Group, Schenectady, NY), dissolved in PGMEA* as 20 wt % solids |
| 3 | Acrylic | Dry-film | Thermoset, negative | Shipley GA-series (GA-20) removed and applied direct, (Rhom & Haas, Inc. Marlborough, MA) |
| 4 | Polyimide | Liquid | Thermoset, Non-photoactive | PI-2611 (HD Microsystems, Parlin, NJ) |
| 5 | Isoprene | Liquid | Thermoset, negative | SC-Resist (Fujifilm Electronic Materials, North Kingston, RI) |

*PGMEA: propylene glycol monomethyl ether acetate

Where applicable, the organic substance is applied in the manner of a coating utilizing a Brewer Science, Inc. CB-100 coater and following standard protocol for applying the liquid form of the polymer material to the inorganic substrate. Once the material is coated, it is sent to a soft bake step for a short 60 sec hot plate bake at 100 degrees C. For negative Acrylic resist, the material is exposed to ultraviolet light of a broadband type emitting at 365 nm and of a high exposure dose of 0.12 W/cm2-sec, for an excessive period of 30 min. Following exposure, the wafer was post-exposure baked at a predetermined hard bake temperature and time depending on the resist. Once the wafer samples have been prepared, they are staged for experimentation. The experiments in Examples 2-6 are all conducted identical to each other using the same wafers and handling practices. Each wafer is staged in the work station where the invention will be demonstrated. Compositions are prepared ahead of time and also set aside. The invention method is tested by applying the composition of interest to a portion of the wafer surface. The wafer is then immediately transferred to a hot plate which has been preset at the desired processing temperature. Once the wafer is set onto the hot plate, a digital timer is started. Once the pre-established 60 seconds has expired, the wafer is removed and immediately rinsed with distilled, deionized, or demineralized water from a wash bottle. The rinsed wafer is observed and set aside to dry. Additional observations are taken and the results are recorded.

Example 1

In all cases, introduction of the sulfopolyester was obtained by the addition of a premade stock solution. These stock solutions were comprised of a hydrophilic solvent (Component A) and a water soluble or water dispersible or water dissipatable polymer (Component B). The polymers chosen were various sulfopolyesters of different glass transition temperatures and viscosities of both the linear and branched varieties. Such polymers are well known to those skilled in the art and are available from Eastman Chemical Company under the tradename of Eastman AQ polymers. In particular, such sulfopolyesters can be dissolved, dispersed or otherwise dissipated in aqueous dispersions, preferably at temperatures of less than about 80° C. Such polyesters are described in greater detail in U.S. Pat. No. 3,734,874 the disclosure of which is incorporated herein by reference. The polyesters considered as candidates for the invention include, but are not limited to, Eastman AQ 38S Polymer, Eastman AQ 48 Ultra Polymer, Eastman AQ 55S Polymer, EastONE S85030 Copolyester, Eastman ES-100 Water-Dispersible Polymer, Eastman AQ 1350 Copolyester, and Eastman AQ 2350 Copolyester. The solvents chosen were ethylene glycol, diethylene glycol, triethylene glycol, propylene glycol, diethylene glycol methyl ether (Eastman DM Solvent), diethylene glycol ethyl ether (Eastman DE Solvent), diethylene glycol propyl ether (Eastman DP Solvent), diethylene glycol butyl ether (Eastman DB Solvent), ethylene glycol propyl ether (Eastman EP Solvent), and ethylene glycol butyl ether (Eastman EB Solvent). In a screening study, solutions were attempted for each of the polymer and solvent pairings at 10, 20, and 30 wt % solids. In addition, solutions of Eastman AQ 38S Polymer and Eastman AQ 48 Ultra Polymer each at 40 wt % solids were attempted in the four Diethylene glycol ether solvents. These stock solutions were prepared by adding the solvent to a round-bottomed flask with an agitator, condenser, and nitrogen source connected. The appropriate amount of the solid sulfopolyester was then added, and the mixture was heated with agitation until the solution was obtained. Depending on the polymer and solvent pairing and the solids loading, the solutions were heated to different temperatures for various times ranging from 90 degrees C. for 30 minutes to 180 degrees C. for 70 minutes. Table 2 below summarizes these stock solutions. "Suitable Solutions" are those in which the polyester dissolved readily under preparation conditions, remained soluble on cooling, and the solution was suitable for making a coating. "Bad Solutions" are those in which either the solids were insoluble in the solvents under the preparation conditions or the solution formed was unstable in the short term. "Disqualified Solutions" are those in which a solution of the same polymer and solvent paring had previously formed a bad solution at a lower solids loading. "Questionable Solutions" are those in which the solutions formed were either extremely viscous or exhibited signs of potential long-term instability, but might be of value for further study.

TABLE 2

Summary of Potential Stock Solutions

| Solution Status | AQ-38 | AQ-48 | AQ-55 | ES-100 | EastONE | AQ-1350 | AQ-2350 |
|---|---|---|---|---|---|---|---|
| Suitable Solutions | 20 | 21 | 3 | 1 | 1 | 18 | 6 |
| Questionable Solutions | 0 | 3 | 2 | 1 | 3 | 2 | 1 |
| Bad Solutions | 11 | 8 | 20 | 12 | 17 | 6 | 15 |
| Disqualified Solutions | 3 | 2 | 5 | 16 | 9 | 4 | 8 |
| Total Solutions | 34 | 34 | 30 | 30 | 30 | 30 | 30 |

Based on this screening study, 82 suitable and questionable solutions were tested on both PHost and Novolac coated wafers which had in both cases been cured at 150 degrees C. for 15 minutes. In each case, a small amount of solution was applied to resin coated wafer, the wafer was immediately heated to 100 degrees C. for 60 seconds, then immediately washed with a stream of water at ambient temperature. A simple visual observation was used to evaluate completeness of resin removal. Only those blends that were judged to exhibit excellent cleaning performance by visual examination were deemed as passing. Table 3 summarizes the results.

TABLE 3

Cleaning of Novolac (N) and PHost (P): (C—Cleaned; F—Failed)

| | | Wt % Solid | | | | | | |
|---|---|---|---|---|---|---|---|---|
| | | 10% | | 20% | | 30% | | 40% | |
| Solvent | Sulfopolyester | P | N | P | N | P | N | P | N |
| Ethylene glycol | AQ-1350 | C | F | | | | | | |
| Ethylene glycol | AQ-38 | C | F | C | F | | | | |
| Ethylene glycol | AQ-48 | C | F | C | F | | | | |
| Ethylene glycol | AQ-55 | C | C | | | | | | |
| Ethylene glycol | EastONE | C | F | | | | | | |
| Ethylene glycol | ES-100 | C | F | | | | | | |
| Diethylene glycol | AQ-1350 | C | F | | | | | | |
| Diethylene glycol | AQ-38 | C | C | C | C | | | | |
| Diethylene glycol | AQ-48 | C | C | C | C | | | | |
| Diethylene glycol | AQ-55 | C | C | | | | | | |
| Propylene glycol | AQ-48 | | | C | F | | | | |
| Propylene glycol | AQ-55 | | | C | F | | | | |
| DM Solvent | AQ-1350 | C | C | C | F | C | F | | |
| DM Solvent | AQ-2350 | C | C | C | F | F | F | | |
| DM Solvent | AQ-38 | C | C | C | F | C | F | F | F |
| DM Solvent | AQ-48 | C | C | C | C | C | F | C | F |
| DE Solvent | AQ-1350 | C | C | C | F | C | F | | |
| DE Solvent | AQ-2350 | C | F | C | F | C | F | | |
| DE Solvent | AQ-38 | C | C | C | C | F | F | C | F |
| DE Solvent | AQ-48 | C | C | C | C | C | F | C | C |
| DP Solvent | AQ-1350 | C | C | C | F | C | C | | |
| DP Solvent | AQ-38 | F | F | C | C | C | C | C | C |
| DP Solvent | AQ-48 | C | C | C | C | C | F | F | F |
| DB Solvent | AQ-1350 | C | C | C | F | C | F | | |
| DB Solvent | AQ-38 | | | C | F | C | C | C | F |
| DB Solvent | AQ-48 | | | C | C | C | C | F | F |
| EP Solvent | AQ-1350 | C | F | C | F | C | C | | |
| EB Solvent | AQ-1350 | C | C | C | F | C | C | | |

The composition comprising diethylene glycol ethyl ether and Eastman AQ 48 Ultra Polymer at solids loadings ranging from 10 wt % all the way up to 40 wt % were found to exhibit broad performance cleaning both PHost and Novolac photoresist resin from silicon substrate. In addition, the various concentrations of these solutions were extremely stable even after several months of storage at room temperature.

Therefore, a composition comprising 20 wt % Eastman AQ 48 and 80 wt % diethylene glycol ethyl ether (Eastman DE Solvent) was selected as the suitable standard composition to be used in developing additive blends in order to target more exotic and more difficult to remove photoresists. This stock solution comprised 30% of the final solutions used to treat wafers in Examples 2-6, yielding 6 wt % sulfopolyester and 24 wt % DE Solvent in all of these solutions. The following examples 2-6 are to demonstrate how one skilled in the art may approach development of a composition according to this invention that is suitable for removal of an organic residue. Neither the selection of this standard composition for further studies nor the specific examples that follow are intended to limit the scope of this invention.

In contrast with the over-all success of many compositions containing a sulfonated polyester, compositions containing other water soluble, dispersible, or dissipatable polymers did not perform nearly as well. In general, these other polymers were far less soluble in the chosen solvents. Process conditions for achieving the solutions again varied depending on the polymer and solvent pairing and the solids loading. In most cases, the solutions were heated to a temperature ranging from 120 degrees C. for 30 minutes up to 180 degrees C. for 80 minutes; however, the polyvinyl pyrollidone and the dendritic polyester were both noticeable exceptions that required far less heating. The results of the solubility study are tabulated below.

TABLE 4

Summary of Stock Solutions not Containing a Sulfonated Polyester

| Solution Status | [1]DPE | [2]AMP | [3]PVP | [4]SPS | [5]HEC | [6]XSS | [7]PVME | [8]CAP |
|---|---|---|---|---|---|---|---|---|
| Suitable Solutions | 0 | 1 | 40 | 0 | 0 | 0 | 10 | 8 |
| Questionable Solutions | 26 | 0 | 0 | 0 | 0 | 6 | 0 | 13 |
| Bad Solutions | 0 | 10 | 0 | 11 | 10 | 4 | 2 | 3 |
| Disqualified Solutions | 4 | 19 | 0 | 19 | 20 | 20 | 18 | 6 |
| Total Solutions | 30 | 30 | 40 | 30 | 30 | 30 | 30 | 30 |

[1]DPE—Dendritic Polyester
[2]AMP—Sulfonated acrylic
[3]PVP—Polyvinyl pyrollidone
[4]SPS—Sulfonated polystyrene
[5]HEC—Hydroxyethyl Cellulose
[6]XSS—Xylene sodium sulfonate
[7]PVME—Polyvinyl methyl ether
[8]CAP—Cellulose acetate phthalate From the suitable and questionable blends prepared, a selection of 49 was tested on both PHOST and Novolac photoresist that had been cured at 150 degrees C. for 15 minutes. In both cases, a small amount of each composition was applied to the resin coated wafer, heated to 100 degrees C. for 60 seconds, and then immediately rinsed off with de-ionized water at ambient temperature. A simple visual inspection was subsequently made, and only those compositions judged to have excellent cleaning performance were deemed as passing. In many cases, only the 10 wt % solids blends were tested; however, solutions with up to 40 wt % solids of the polyvinyl pyrollidone were also tested because that particular polymer was so soluble in every solvent tested. With the exception of xylene sodium sulfonate, the results were almost wholly negative, and further testing was deemed unnecessary. The results of the performance screening are summarized below.

TABLE 5

Cleaning of Novolac (N) and PHOST (P): (C—Cleaned; F—Failed)

| | | Wt % Solids | | | | | | |
|---|---|---|---|---|---|---|---|---|
| | | 10% | | 20% | | 30% | | 40% | |
| Solvent | Polymer | P | N | P | N | P | N | P | N |
| Ethylene glycol | [1]AMP | C | F | | | | | | |
| Ethylene glycol | [2]PVP | F | F | | | | | F | F |
| Diethylene glycol | [3]DPE | C | F | | | | | | |
| Diethylene glycol | PVP | F | F | | | | | F | F |
| Diethylene glycol | [4]XSS | C | C | | | | | | |
| Diethylene glycol | [5]CAP | C | F | | | | | | |
| Triethylene glycol | PVP | F | F | | | | | F | F |
| Triethylene glycol | XSS | C | F | | | | | | |
| Triethylene glycol | CAP | C | F | | | | | | |
| Propylene glycol | PVP | F | F | | | | | F | F |
| Propylene glycol | XSS | C | C | | | | | | |
| DM Solvent | PVP | F | F | | | | | F | F |
| DM Solvent | XSS | C | C | | | | | | |
| DM Solvent | [6]PVME | F | F | F | F | F | F | | |
| DM Solvent | CAP | F | F | C | F | | | | |
| DE Solvent | DPE | C | F | | | | | | |
| DE Solvent | PVP | F | F | | | | | F | F |
| DE Solvent | XSS | C | C | | | | | | |
| DE Solvent | PVME | F | F | F | F | F | F | | |
| DE Solvent | CAP | F | F | | | | | | |
| DP Solvent | DPE | F | F | | | | | | |
| DP Solvent | PVP | F | F | | | | | F | F |
| DP Solvent | XSS | C | F | | | | | | |
| DP Solvent | PVME | C | F | F | F | | | | |
| DP Solvent | CAP | F | F | | | | | | |
| DB Solvent | PVP | F | F | | | | | F | F |
| DB Solvent | PVME | C | F | C | F | | | | |
| DB Solvent | CAP | F | F | | | | | | |
| EP Solvent | DPE | F | F | | | | | | |
| EP Solvent | PVP | F | F | | | | | F | F |
| EP Solvent | CAP | F | F | | | | | | |
| EB Solvent | PVP | F | F | | | | | F | F |

[1]AMP—Sulfonated acrylic
[2]PVP—Polyvinyl pyrollidone
[3]DPE—Dendritic Polyester
[4]XSS—Xylene sodium sulfonate
[5]CAP—Cellulose acetate phthalate
[6]PVME—Polyvinyl methyl ether Very few solutions exhibited success in cleaning both PHOST and Novolac photoresist, and the few compositions that did have this success were questionable solutions that were non-ideal for use in this invention. By comparison, many compositions containing sulfonated polyesters exhibited much better performance dissolving PHOST and Novolac photoresist. The compositions containing sulfonated polyesters were significantly preferable to those containing any of the other polymers considered, and a single composition from those containing sulfonated polyesters was chosen for future testing.

Example 2

Table 4 contains the results from a cleaning study conducted for PHost resin coated as described in Table 1. Resin was cured for 15 minutes at 200 degrees C. All cleaning compositions are comprised of 6 wt % sulfopolyester, 24 wt % DE Solvent, with the remaining 70 wt % being comprised of two additives as noted in Table 6. Process temperatures for the cleaning stage were 100 degrees C., 150 degrees C., and 200 degrees C.

TABLE 6

Cleaning Results for PHost Resin

| Additive A | Additive B | Additive A:B wt % Concentrations | 100° C. | 150° C. | 200° C. |
|---|---|---|---|---|---|
| [1]NMP | [2]TMAH | 65:5 | Clean | Clean | Clean |
| NMP | TMAH | 50:20 | Clean | Clean | Clean |
| NMP | [3]KTB | 65:5 | Clean | Clean | Clean |
| NMP | KTB | 50:20 | Clean | Clean | Clean |
| NMP | [4]MEA | 65:5 | Clean | Not Clean | Not Clean |
| NMP | MEA | 50:20 | Clean | Clean | Not Clean |
| NMP | $H_3PO_4$ | 65:5 | Clean | Clean | Not Clean |
| NMP | $H_3PO_4$ | 50:20 | Clean | Clean | Clean |
| NMP | [5]MSA | 65:5 | Clean | Clean | Clean, some |
| NMP | MSA | 50:20 | Clean | Clean | Clean |
| [6]DMSO | TMAH | 65:5 | Clean | Clean | Clean |
| DMSO | TMAH | 50:20 | Clean | Clean | Clean |
| DMSO | KTB | 65:5 | Clean | Clean | Clean |
| DMSO | KTB | 50:20 | Clean | Clean | Clean |
| DMSO | MEA | 65:5 | Clean | Clean, most | Not Clean |
| DMSO | MEA | 50:20 | Clean | Clean | Not Clean |
| DMSO | $H_3PO_4$ | 65:5 | Clean | Clean, most | Clean |
| DMSO | $H_3PO_4$ | 50:20 | Clean | Clean | Clean |
| DMSO | MSA | 65:5 | Clean | Clean | Not Clean |
| DMSO | MSA | 50:20 | Clean | Clean | Clean |

[1]NMP—N-methyl-2-pyrrolidone
[2]TMAH—Tetramethylammonium hydroxide (20 wt % in propylene glycol)
[3]KTB—Potassium tert-butoxide (20 wt % in propylene glycol)
[4]MEA—Monoethanol amine
[5]MSA—Methanesulfonic acid
[6]DMSO—Dimethylsulfoxide The data in Table 4 suggest that most solutions will perform well in dissolving and removing the PHost resin, even at high exposure temperatures of 200 degrees C. The solutions enriched with higher concentrations of acid or base additives exhibited improved results. At both levels of enrichment, solutions containing MEA did not perform well removing PHost cured at high temperatures. The primary conclusion here is that PHost is relatively easy to process at 60 seconds with the invention method and compositions.

Example 3

Table 5 contains the results from a cleaning study conducted for Novolac resin coated as described in Table 1. Resin was cured for 15 minutes at 200 degrees C. All cleaning compositions were comprised of 6 wt % sulfopolyester, 24 wt % DE Solvent, with the remaining 70 wt % being comprised of two additives as noted in Table 7. Process temperatures for the cleaning stage were 100 degrees C., 150 degrees C., and 200 degrees C.

TABLE 7

Cleaning Results for Novolac Resin

| Additive A | Additive B | Additive A:B wt % Concentrations | 100° C. | 150° C. | 200° C. |
|---|---|---|---|---|---|
| [1]NMP | [2]TMAH | 65:5 | Clean | Not Clean | Clean |
| NMP | TMAH | 50:20 | Not Clean | Clean | Clean |
| NMP | [3]KTB | 65:5 | Clean | Clean | Not Clean |
| NMP | KTB | 50:20 | Clean | Clean | Clean |
| NMP | [4]MEA | 65:5 | Clean | Clean | Not Clean |
| NMP | MEA | 50:20 | Clean | Clean | Not Clean |
| NMP | $H_3PO_4$ | 65:5 | Not Clean | Clean | Not Clean |
| NMP | $H_3PO_4$ | 50:20 | Not Clean | Clean | Clean |
| NMP | [5]MSA | 65:5 | Clean | Clean | Not Clean |
| NMP | MSA | 50:20 | Clean | Clean | Clean |
| [6]DMSO | TMAH | 65:5 | Clean | Clean | Clean |
| DMSO | TMAH | 50:20 | Clean | Clean | Clean |
| DMSO | KTB | 65:5 | Clean | Clean | Clean |
| DMSO | KTB | 50:20 | Clean | Clean | Clean |
| DMSO | MEA | 65:5 | Clean | Not Clean | Not Clean |
| DMSO | MEA | 50:20 | Clean | Clean | Not Clean |
| DMSO | $H_3PO_4$ | 65:5 | Not Clean | Clean | Not Clean |
| DMSO | $H_3PO_4$ | 50:20 | Not Clean | Not Clean | Not Clean |
| DMSO | MSA | 65:5 | Clean | Not Clean | Not Clean |
| DMSO | MSA | 50:20 | Clean | Clean | Not Clean |

[1]NMP—N-methyl-2-pyrrolidone
[2]TMAH—Tetramethylammonium hydroxide (20 wt % in propylene glycol)
[3]KTB—Potassium tert-butoxide (20 wt % in propylene glycol)
[4]MEA—Monoethanol amine
[5]MSA—Methanesulfonic acid
[6]DMSO—Dimethylsulfoxide Table 5 suggests that most additive combinations are suitable for cleaning cured Novolac resin from silica substrates; however, some difficulty is encountered when cleaning at 200° C. Acidic solutions do not produce desirable results especially on highly cured novolac resin, with phosphoric acid containing compositions failing in nearly every attempt.

Example 4

Table 6 contains the results from a cleaning study conducted for acrylic resin coated as described in Table 1. Resin was cured for 15 minutes at 150 degrees C. All cleaning compositions were comprised of 6 wt % sulfopolyester, 24 wt % DE Solvent, with the remaining 70 wt % being comprised of two additives as noted in Table 8. Process temperatures for the cleaning stage were 100 degrees C., 150 degrees C., and 200 degrees C. Results are tabulated below.

TABLE 8

Cleaning Results for Acrylic Resin

| Additive A | Additive B | Additive A:B wt % Concentrations | 100° C. | 150° C. | 200° C. |
|---|---|---|---|---|---|
| [1]NMP | [2]TMAH | 65:5 | Clean | Partial Clean | Partial Clean |
| NMP | TMAH | 50:20 | Clean | Partial Clean | Clean |
| NMP | [3]KTB | 65:5 | Clean | Partial Clean | Partial Clean |
| NMP | KTB | 50:20 | Clean | Clean | Partial Clean |
| NMP | [4]MEA | 65:5 | Clean | Partial Clean | Partial Clean |
| NMP | MEA | 50:20 | Partial Clean | Partial Clean | Partial Clean |
| NMP | $H_3PO_4$ | 65:5 | Partial Clean | Partial Clean | Partial Clean |

TABLE 8-continued

Cleaning Results for Acrylic Resin

| Additive A | Additive B | Additive A:B wt % Concentrations | 100° C. | 150° C. | 200° C. |
|---|---|---|---|---|---|
| NMP | H₃PO₄ | 50:20 | Partial Clean | Partial Clean | No Clean |
| NMP | ⁵MSA | 65:5 | Partial Clean | Partial Clean | Partial Clean |
| NMP | MSA | 50:20 | Partial Clean | Partial Clean | Partial Clean |
| ⁶DMSO | TMAH | 65:5 | Clean | Partial Clean | Partial Clean |
| DMSO | TMAH | 50:20 | Clean | Partial Clean | Clean |
| DMSO | KTB | 65:5 | Clean | Partial Clean | Partial Clean |
| DMSO | KTB | 50:20 | Partial Clean | Partial Clean | Partial Clean |
| DMSO | MEA | 65:5 | Clean | Partial Clean | Partial Clean |
| DMSO | MEA | 50:20 | Clean | Partial Clean | Partial Clean |
| DMSO | H₃PO₄ | 65:5 | Partial Clean | Partial Clean | Partial Clean |
| DMSO | H₃PO₄ | 50:20 | Not Clean | Not Clean | Not Clean |
| DMSO | MSA | 65:5 | Partial Clean | Partial Clean | Partial Clean |
| DMSO | MSA | 50:20 | Partial Clean | Partial Clean | Partial Clean |

¹NMP—N-methyl-2-pyrrolidone
²TMAH—Tetramethylammonium hydroxide (20 wt % in propylene glycol)
³KTB—Potassium tert-butoxide (20 wt % in propylene glycol)
⁴MEA—Monoethanol amine
⁵MSA—Methanesulfonic acid
⁶DMSO—Dimethylsulfoxide Table 6 suggests that cured acrylic resin is more difficult to clean than either PHOST or novolac resin. Only the use of highly basic materials such as TMAH, MEA, or KTB in the additive component produced desirable results on low temperature cleaned wafers.

Example 5

Table 7 contains the results from a cleaning study conducted for Polyimide resin coated as described in Table 1. After the soft bake, wafers were cured for 15 minutes at 200 degrees C. followed by an additional 30 minutes at 350 degrees C. All cleaning compositions were comprised of 6 wt % sulfopolyester, 24 wt % DE Solvent, with the remaining 70 wt % being comprised of three additives as noted in Table 9. Process temperatures for the cleaning stage were 100 degrees C., 150 degrees C., and 200 degrees C. Results are tabulated below.

TABLE 9

Cleaning Results for Polyimide Resin

| Additive A | Additive B | Additive C | Additive A:B:C wt % Concentrations | 100° C. | 150° C. | 200° C. |
|---|---|---|---|---|---|---|
| ¹NMP | DMSO | MEA | 23.5:23.5:23 | Not clean | Not clean | Not clean |
| NMP | DMSO | ³KTB | 23.5:23.5:23 | Not clean | Clean | Clean |
| NMP | DMSO | ²TMAH | 23.5:23.5:23 | Not clean | Clean | Clean |
| NMP | ⁵Surf | ⁴MEA | 46:2:22 | Not clean | Not clean | Not clean |
| NMP | Surf | KTB | 46:2:22 | Not clean | Clean | Clean |
| NMP | Surf | TMAH | 46:2:22 | Clean | Clean | Clean |
| DMSO | None | MEA | 47:23 | Not clean | Not clean | Not clean |
| DMSO | None | KTB | 47:23 | Not clean | Not clean | Clean |
| DMSO | None | TMAH | 47:23 | Not clean | Clean | Clean |
| DMSO | Surf | MEA | 46:2:22 | Not clean | Not clean | Not clean |
| DMSO | Surf | KTB | 46:2:22 | Not clean | Clean | Clean |
| DMSO | Surf | TMAH | 46:2:22 | Not clean | Clean | Clean |
| DMSO | ⁷DMSO₂ | ⁸KTB + MEA | 27.5:23.5:23 | Not clean | Clean | Clean |
| NMP | DMSO | ⁸KTB + MEA | 27.5:23.5:23 | Not clean | Clean | Clean |

¹NMP—N-methyl-2-pyrrolidone
²TMAH—Tetramethylammonium hydroxide (20 wt % in propylene glycol)
³KTB—Potassium tert-butoxide (20 wt % in propylene glycol)
⁴MEA—Monoethanol amine
⁵Surf—Nonionic alkyl polyethylene glycol ether surfactant
⁶DMSO—Dimethylsulfoxide
⁷DMSO₂—Dimethylsulfone
⁸KTB + MEA—equal weights of 20 wt % potassium t-butoxide in propylene glycol and monoethanol amine Table 7 suggests that higher process temperatures yield best results for cleaning polyimide resin from inorganic substrates. Virtually no good results were observed at a process temperature of 100 degrees C. Additionally, polyimide removal required a strong alkali component with a pKa equal to or greater than 12. In all instances where MEA is present alone in the composition as the only alkali, cleaning results were not acceptable. The presence of KTB or TMAH did promote good results.

Example 6

Table 8 contains the results from a cleaning study conducted for Isoprene resin coated as described in Table 1. Wafers were cured for 15 minutes at 150 degrees C. All cleaning compositions were comprised of 6 wt % sulfopolyester, 24 wt % DE Solvent, with 68 wt % being comprised of two additives as noted in Table 7 and 2 wt % being comprised of a surfactant such as Zelec™ UN (alkoxyphosphate ester surfactant). Process temperatures for the cleaning stage were 100 degrees C., 150 degrees C., and 200 degrees C.

TABLE 10

Cleaning Results for Isoprene Resin

| Additive A | Additive B | Additive A:B wt % Concentrations | 100° C. | 150° C. | 200° C. |
|---|---|---|---|---|---|
| [1]Aromatic 150 Fluid | [2]DDBSA | 41:27 | Not Clean | Clean | Clean |
| 1-Dodecene | DDBSA | 41:27 | Not Clean | Clean | Clean |

[1]Aromatic 150 Fluid from ExxonMobil Chemical
[2]DDBSA—dodecylbenzenesulfonic acid The cleaning composition presented in Table 10 was designed to be significantly hydrophobic (hydrocarbon) in order to allow penetration of the cleaning composition into the resin. The compositions shown here represent a key condition that is necessary to affect proper performance. Elevated temperatures were found necessary to adequately remove the rubber-like isoprene photoresist from the inorganic substrate in 60 seconds.

The invention has been described in detail with particular reference to preferred embodiments thereof, but it will be understood that variations and modifications can be effected within the spirit and scope of the invention.

We claim:

1. A composition for removing organic resin from inorganic substrates comprising,
   at least about 30 weight % of an organic solvent or mixture of solvents, and
   at least one sulfonated polyester at weight % of from about 0.5% to about 99.0%, and
   at least one additive selected from the group consisting of an ammonium hydroxide, a quaternary ammonium hydroxide, an amine, an alkanolamine, an elemental hydroxide, an elemental alkoxide, and mixtures thereof at a weight % of from about 0.01% to about 99.0%,
   wherein the solvent is selected from the group consisting of ethylene glycol, diethylene glycol, propylene glycol, diethylene glycol ethyl ether, diethylene glycol methyl ether, diethylene glycol butyl ether, diethylene glycol propyl ether, ethylene glycol propyl ether, ethylene glycol butyl ether and mixtures thereof.

2. The composition according to claim 1, wherein the solvent is at a weight % of from about 30% to about 95%, the polymer is at a weight of from about 3% to about 60%, and the additive is at a weight % of from about 2% to about 60%.

3. The composition according to claim 1, wherein the additive is selected from the group consisting of tetramethylammonium hydroxide, tetraethylammonium hydroxide, benzyltrimethylammonium hydroxide, triethylene tetramine, monoethanolamine, monoisopropanolamine, diglycolamine, 1,2-diaminoethane, 1,3-diaminomethylbenzene, 1,3-diaminomethylcyclohexane, potassium tertiary butyl hydroxide, and mixtures thereof.

4. The composition according to claim 1, wherein the additive is methanesulfonic, p-toluenesulfonic, dodecylbenzene sulfonic acid, formic acid, sulfuric acid, nitric acid, phosphoric acid or a mixture thereof.

5. The composition according to claim 1, further comprising an inhibitor, a surfactant or both.

* * * * *